United States Patent [19]
Papapietro et al.

[11] Patent Number: 5,574,309
[45] Date of Patent: Nov. 12, 1996

[54] INTEGRATED CIRCUIT CARD COMPRISING MEANS FOR THE PROTECTION OF THE INTEGRATED CIRCUIT

[75] Inventors: Michel Papapietro, Lyons; Jean-Christophe Fidalgo, Aubagne; Jöel Turin, Marseille, all of France

[73] Assignee: Gemplus Card International, Gemenos Cedex, France

[21] Appl. No.: 244,364

[22] PCT Filed: Nov. 25, 1992

[86] PCT No.: PCT/FR92/01091

§ 371 Date: Aug. 15, 1994

§ 102(e) Date: Aug. 15, 1994

[87] PCT Pub. No.: WO93/11564

PCT Pub. Date: Jun. 10, 1993

[30] Foreign Application Priority Data

Nov. 25, 1991 [FR] France ..................... 91 14505

[51] Int. Cl.$^6$ ......................................... H01L 23/02
[52] U.S. Cl. ............................. 257/679; 257/698
[58] Field of Search ......................... 257/679, 698

[56] References Cited

U.S. PATENT DOCUMENTS

| | | | |
|---|---|---|---|
| 4,532,419 | 7/1985 | Takeda | 257/679 |
| 4,649,418 | 3/1987 | Uden | 257/679 |
| 4,910,582 | 3/1990 | Miyamoto et al. | 257/679 |
| 5,272,374 | 12/1993 | Kodai et al. | 257/679 |

FOREIGN PATENT DOCUMENTS

A-0412545  2/1991  European Pat. Off. .

OTHER PUBLICATIONS

Document Number Japan Abstract No. JP3002099 Date Mar. 1991 Country EPO.

Document Number Japan Abstract No. JP3076693 Date Jun. 1991 Country EPO.

Document Number Japan Abstract No. JP3009892 Date Mar. 1991 Country EPO.

Document Number Japan Abstract No. JP3009893 Date Mar. 1991 Country EPO.

Document Number Japan Abstract No. JP2009691 Date Mar. 1990 EPO.

Document Number Japan Abstract No. JP2030597 Date Apr. 1990 EPO.

Document Number Japan Abstract No. JP2059399 Date May 1990 EPO.

Document Number Japan Abstract No. JP2150101 Date Aug. 1990 EPO.

*Primary Examiner*—Sara W. Crane
*Assistant Examiner*—S. V. Clark
*Attorney, Agent, or Firm*—Nilles & Nilles, S.C.

[57] ABSTRACT

A system for protecting integrated circuits on smart cards is described. The circuit (103) is placed in a cavity (102) in a ceramic package (101). Standard contacts (104) are deposited on the side of the package opposite to the cavity opening and connected to the chip (103) via feed-through conductors (106) extending into the cavity (102) and connected therein to wires (105) which are welded to the chip (103). The cavity (102) is either sealed by a lead (108) or filled with a protective material (208). Smart cards with a lifetime of over ten years may thus be obtained.

15 Claims, 2 Drawing Sheets

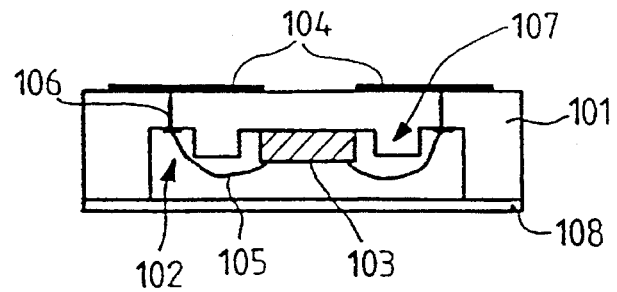
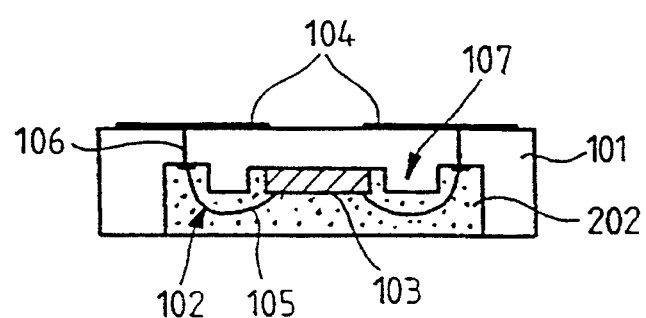
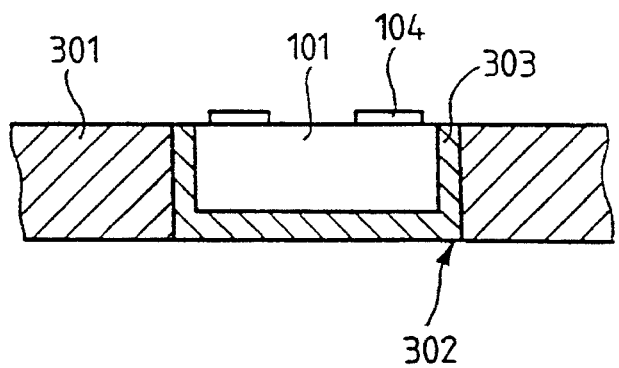
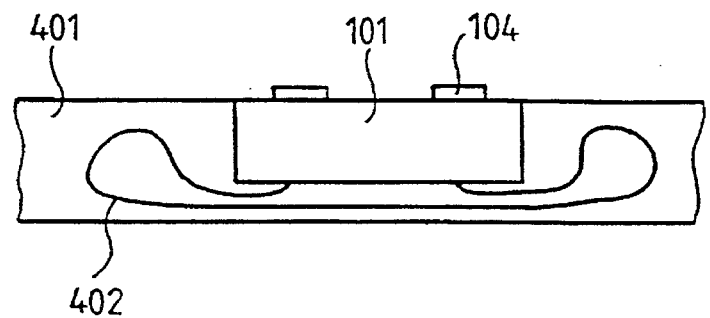

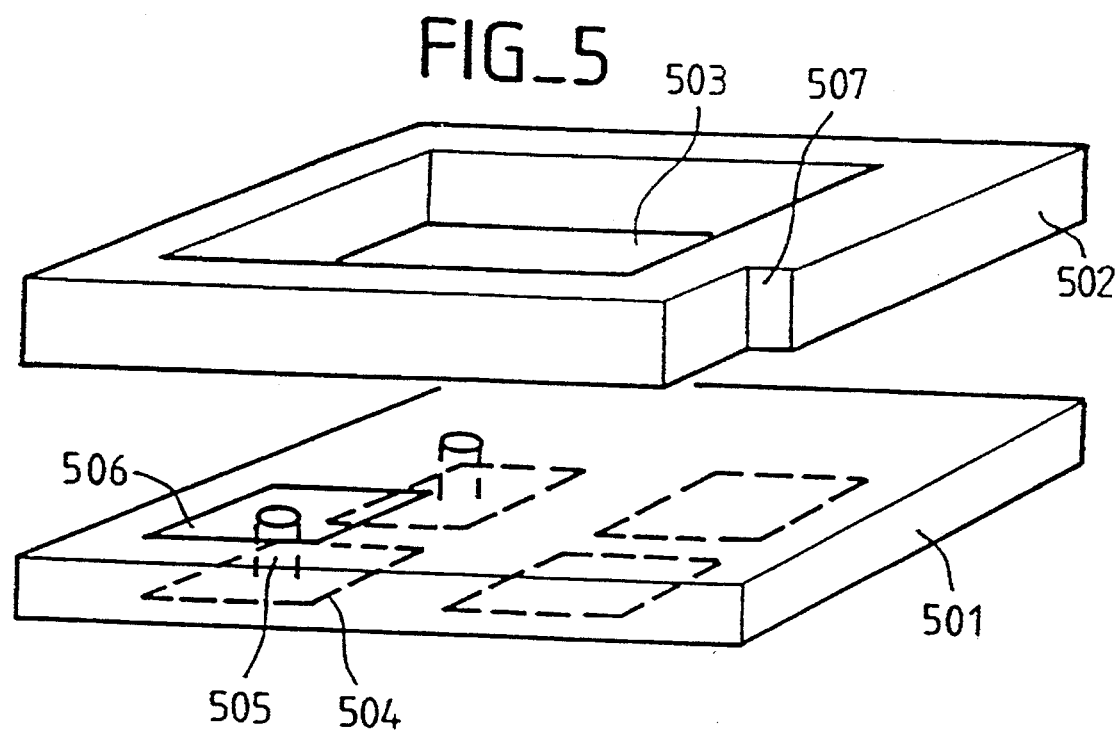

INTEGRATED CIRCUIT CARD COMPRISING MEANS FOR THE PROTECTION OF THE INTEGRATED CIRCUIT

The present invention relates to integrated circuit cards, also known as "smart cards" or "chip cards", comprising an integrated circuit that is positioned in the thickness of the card and is accessible from the outside by means of a standardized connector to enable various functions to be fulfilled. These cards are now well known and have many functions such as providing access to public telephone booths or enabling the distribution of money in cash-dispensing machines.

At present, the integrated circuit is generally bonded to a piece of printed circuit that constitutes a flexible package and has tracks to which it is joined by connection wires. The tracks of the printed circuit are etched so as to form the standardized connector designed to supply the chip with electricity and exchange the necessary signals with it. The unit is integrated into the thickness of the card which is generally constituted by a layering of laminated plastic sheets. The external layer on the connector side is cut out so as to leave access to the tracks forming this connector.

The chip is generally protected by the material constituting the card with, if need be, the interposition of a layer of relatively soft material between the chip and the card. This soft layer is positioned either during the manufacture of the card or during the fixing of the chip to the printed circuit. This layer is formed, for example, by a layer of encapsulating resin that is then polymerized. As a variant, the integrated circuit is itself reinforced, for example by the bonding of a cobalt wafer beneath the semiconductor substrate of the integrated circuit. This protection is further increased if the material constituting the printed circuit is replaced by a plate of resin reinforced with glass fibers. However, this type of mechanical protection is still insufficient.

During its lifetime, which may be very long, a chip card is subjected to numerous stresses both when it is not being used and when it is being used. Thus, it may be carried in a user's pocket and subjected to all sorts of external forces. Furthermore, when it is used, it is inserted into a card reader that exerts a pressure on it. This pressure may be far from negligible and may vary from one reader to another. Furthermore the card, during the operations in which it is inserted into the reader and extracted therefrom, is frequently subjected to bending or twisting motions.

Experience shows that the chip-protecting means used until now have not been completely satisfactory, especially for cards designed to be used for lengthy periods as is the case, for example, with a card containing personal data such as a medical file for example. In the invention, a package is thus used to contain the integrated circuit and also to act as a rigidity element. Thus, the constraints of electrical insulation, which are necessary to obtain the independence of the different metallizations, are met by making the package out of ceramic. This very rigid package then, unfortunately, cannot be used in a mass production system wherein, for example, all the empty packages would be placed on a continuous conveyer belt moving past an insertion and micro-connection machine. This, on the contrary, is the case when the printed circuit is made in a conventional way. The belt or band is in this case formed by the material of the printed circuit. To resolve this problem, the manufacturing line is modified completely by using shuttles in which empty packages made of ceramic are placed. These shuttles are, each in its turn, presented to the insertion machines which then line each package in the shuttle with an integrated circuit and connect it.

To increase the protection of the chip, the invention therefore proposes an integrated circuit card, of the type comprising an integrated circuit positioned inside a card and connected to means of connection with the exterior, and comprising a package to hold this integrated circuit comprising a cavity that opens into one of its faces and makes it possible to receive the integrated circuit, this package including, on its other face, said means to connect the card with the exterior, and these connection means being connected to the integrated circuit by feed-through conductors, vias, connecting the contacts to the interior of the cavity and to connection wires connected to the integrated circuit, wherein this holding package is made out of a ceramic material to contribute to the protection of the integrated circuit.

Other particular features and advantages of the invention shall appear clearly from the following description, given by way of a non-restrictive example with reference to the appended figures, of which:

FIG. 1 shows a sectional view of a protection package provided with a chip for cards and designed to be integrated into a chip card;

FIG. 2 shows an alternative embodiment of the package of FIG. 1;

FIG. 3 shows a sectional view of a part of a chip card comprising a package according to the invention; and FIG. 4 shows a sectional view of a part of a chip card, according to the invention, of the "label" type;

FIG. 5 shows the steps of a preferred method of manufacture of a ceramic package.

MORE DETAILED DESCRIPTION

FIG. 1 shows a sectional view of a ceramic package 101 whose thickness is small enough to enable it to be integrated into the thickness of the chip card. To this end, the thickness of the package, including the lid, will preferably be smaller than 0.6 mm.

This package has a countersunk feature that forms a cavity 102 which opens into one of the large faces of the package. Inside this cavity, there has been placed a chip 103, i.e. an integrated circuit that is adequate for the planned uses of the card into which the package will be integrated. This chip is fixed, by bonding for example, flat on to the bottom of the cavity 102 so that its face comprising diffusions and metallizations forming the integrated circuit proper is free and pointed towards the aperture of the package.

On the face of the package opposite the one that has been hollowed out, there is a placed a set of contacts 104 designed to provide for the connections with the chip. These contacts are preferably made according to standards, ISO standards in principle, which are commonly used in chip cards. They may be obtained by any technique for the deposition of a conductive layer on ceramic, for example vacuum spraying or silk-screen printing.

This ceramic package is made out of a ceramic material that is both resistant to in order to protect the chip and has a breaking point that is high enough to withstand the strains referred to further above without breaking. The ceramic-manufacturing techniques known in the prior art can be used to obtain a package such as this that meets these specifications. A preferred technique is described further below.

The output points of the chip 103 are connected to the contacts 104 by means of flexible wires 105 that are fixed in a known way, by ultrasonic soldering for example, by one side to these output points and by the other side to feed-through conductors 106 that go through the thickness of the package, at the level of the contacts 104, and connect these contacts to the interior of the cavity 102. Feed-through conductors such as these, made through a ceramic layer, are known in the prior art and their method of manufacture is similar, for example, to that used to form conductive holes connecting the two faces of one and the same printed circuit.

The lower face of the cavity 102 will preferably be made so as to obtain a boss 107, for example a circular boss, that can be used to surround the chip 103 to obtain different results. This boss makes it possible to give the package the maximum thickness while limiting the depth of the cavity 102 to the positions strictly necessary for the positioning of the chip and to connect the wires 105 to the feed-through conductors 106 in order to increase the solidity of the package.

In the example described, the cavity 102 is not filled, except with air from the manufacturing shop, and the package is closed by means of a lid 108 fixed to the edges of this package, by bonding for example. The material out of which the lid is made may be of different types. For example, it may be a ceramic of the same nature as the one forming the package proper. Since the thickness is very small, it is preferable, however, to use a more elastic material which may be a metal foil for example.

As a variant, FIG. 2 shows a package that is quite identical with that of FIG. 1 but wherein the lid is eliminated and wherein the material used to protect the chip 103 and its connection wires 105 is a filler material 202, for example a polymerizable resin that is cast into the cavity 102 and forms a layer whose lower face is the same as the lower face of the package 101.

FIG. 3 shows a partial sectional view of a chip card 301 into which there is integrated a package 101 comprising a chip. The details of the package are not shown because they are the same as those of FIG. 1 or FIG. 2.

The connectors 104 of the package are flush with the level of the upper face of the card. The lower face of this card is formed by a very thin film 302 whose role essentially is to hold the package 101 during the card-manufacturing process and to then prevent it from being expelled by being punched out. To improve the protection of the package as well as that of the chip that it contains, a variant of the invention in this example uses a layer of a polymer 303 that fills the gap between the package and the card on the sides of the package and between the bottom and the lower face of the card. This polymer, which is a silicon resin for example, can be used to hold the package in the card while at the same time absorbing, to a great extent, the bending and twisting forces that are applied to the card and are transmitted by this card to the package. This elastomer will be, for example, constitute an encapsulation during the manufacture of the card.

The use of a ceramic package such as this enables the deposition, between its contacts, of a colored layer that possibly extends over the upper face of the card and may form part of the decoration or of the technical particulars, generally placed on the surface of the chip cards. The material used indeed enables the clinging of the different colored enamels or of the paints habitually used in this technique.

FIG. 4 shows a variant of the invention in which the package 101 is placed in a card 401, in this example without the polymer layer of the previous example. This card 401 is of the so-called "label" type enabling its use at a distance without contact with the card and hence with the integrated circuit contained in the package 101. To this end, certain outputs of this chip are connected to a connection wire 402 that extends in a folded way into the thickness of the card so as to form an induction coil enabling the wireless transmission of the information elements between an external using device and the card.

In the example shown, the wire 402 re-enters the package 101 by its lower face, corresponding to the cavity in which the chip is located, but any other variant may be used, for example a connection by means of the contacts 104. These contacts, which herein nevertheless remain on the upper face of the package and hence of the card, enable different operations, for example the programming and/or the testing of the chip located in the package. A "label" made in this way can then ensure the identification of the object to which it is fixed, even if this object is placed in a particularly harsh environment.

FIG. 5 shows a preferred method for the manufacture of a ceramic package. First of all, a compound of the following materials is mixed and molded: aluminium powder, powdered minerals such as manganese oxide or silicon oxide for example and fine filler powders to give cohesion. With this mixture, compression and light heating are used to make a relatively compact and solid strip. This strip is then cut out into a set of elements, each used to constitute a package. The elements may furthermore be stacked on top of one another to constitute a package.

In a preferred example, the package is formed by a flat base element 501 with dimensions, for example, of 10 mm by 10 mm. This base is surmounted by a hollow, flat element 502 that has the same external dimensions as the base but is provided with a passage 503, with a size for example of 5 mm by 5 mm, designed to receive the integrated circuit. The thickness of the base is equal to the thickness permitted for the connection, for example 0.2 mm. The thickness of the hollow element is, for example, 0.4 mm. The base plate is provided, on the face designed for the contact with the chip card readers, with metallizations 504 that are preferably made by printing done with a tungsten-based ink. Holes 505 are made at the position of the metallizations of this base. Metallizations 506 made in the same way as the metallizations 504 may be made on the other side of the element 501. They will be used to connect the integrated circuit. The holes 505 are then filled with a tungsten composition. When this is over, the two elements are stacked and pressed against each other by hot rolling. Then, the package thus made is baked at high temperature, for example at 1600 degrees for about 40 hours. Then, the metallizations may be covered with a metal contact layer made of gold, copper or silver as the case may be.

The hollow element then forms a small wall that surrounds the integrated circuit and plays a useful part in its protection.

For the positioning of the integrated circuits in the cavities formed by these packages, all these packages are stowed in housings made in a manufacturing shuttle. This shuttle is a support with cavities that have the dimensions of these packages. The orientation of the packages in this shuttle may be facilitated by the symmetrical character of the connections. It is improved by the presence of a vertical polarizing notch 507 formed in the hollow plate 502. The insertion machine recognizes this notch, or a physical structure having the same function, and orients the chip accurately before it is inserted. If need be, the machine tests the position of the notch and does not insert the chip or connect it unless this orientation is right. Subsequently, the shuttle is rotated by 90° and the operation is started again. The operation is continued in this way for the four possible orientations. The polarization can also be done in another way, for example in the element 501 or according to an orientation other than the vertical one.

As a variant, the package is made only with the base, the integrated circuit being molded or encapsulated in polymerizable resin after its connection to the base.

The invention thus described therefore enables the protection of the chip cards during the manufacture of the chips, which improves the efficiency during the assembly of the chips in chip cards for large-sized chips such as microprocessors, as well as throughout the lifetime of the card which may be greater than 10 years.

We claim:

1. An integrated circuit card comprising:

an integrated circuit;

a card body; and a package, the package being housed in the card body, the package housing the integrated circuit, the package being formed of a ceramic material, the package having a cavity formed therein to hold the integrated circuit, the cavity opening out on a first face of the package to receive the integrated circuit, and the package further comprising means for connecting the integrated circuit with the exterior, the connection means further comprising metallizations positioned on a second face of the package, the second face being opposed to the first face, feed-through conductors connected to the metallizations and connecting the metallizations electrically to the interior of the cavity, and connection wires connected to the integrated circuit and to the feed-through conductors;

wherein the package has a lid fixed to the package to close the cavity and the lid is formed out of a metallic material.

2. An integrated circuit card comprising:

an integrated circuit;

a card body;

a package, the package being housed in the card body, the package housing the integrated circuit, the package being formed of a ceramic material, the package having a cavity formed therein to hold the integrated circuit, the cavity opening out on a first face of the package to receive the integrated circuit, and the package further comprising means for connecting the integrated circuit with the exterior, the connection means further including metallizations positioned on a second face of the package, the second face being opposed to the first face, feed-through conductors connected to the metallizations and connecting the metallizations electrically to the interior of the cavity, and connection wires connected to the integrated circuit and to the feed-through conductors; and an elastic layer forming the junction between the body of the card and the package.

3. An integrated circuit card according to claim 2, characterized in that the package has a lid fixed to the package to close the cavity.

4. An integrated circuit card according to claim 3, characterized in that the lid is formed out of the same material as the package.

5. An integrated circuit card according to claim 1, characterized in that the cavity is filled with a protective material.

6. An integrated circuit card according to claim 1, characterized in that it further comprises a conductive wire that is connected to the integrated circuit and is embedded in the thickness of the body of the card to form an induction coil designed for transmission without contacts.

7. An integrated circuit card according to claim 1, characterized in that the package has a ceramic base.

8. An integrated circuit card according to claim 7, characterized in that the ceramic base supports a resin molding of the integrated circuit.

9. An integrated circuit card comprising:

an integrated circuit;

a card body;

a package, the package being housed in the card body, the package housing the integrated circuit, the package being formed of a ceramic material, the package having a cavity formed therein to hold the integrated circuit, the cavity opening out on a first face of the package to receive the integrated circuit, and the package further comprising means for connecting the integrated circuit with the exterior, the connection means further including metallizations positioned on a second face of the package, the second face being opposed to the first face, feed-through conductors connected to the metallizations and connecting the metallizations electrically to the interior of the cavity, connection wires connected to the integrated circuit and to the feed-through conductors, and a ceramic base, the base being provided with a polarization means to recognize its orientation.

10. An integrated circuit card according to claim 7, characterized in that the base is surrounded by a small wall made of ceramic.

11. An integrated circuit card according to claim 1, wherein the integrated circuit card is a smart card.

12. A package according to claim 14, characterized in that the cavity is filled with a protective material.

13. A package according to claim 14, characterized in that the ceramic base supports a resin molding of the integrated circuit.

14. A package for housing an integrated circuit, the package being capable of being housed in a card body of an integrated circuit card, the package being formed of a ceramic material, the package having a cavity formed therein to hold the integrated circuit, the cavity opening out on a first face of the package to receive the integrated circuit, and the package further comprising means for connecting the integrated circuit with the exterior, the connection means further comprising metallizations positioned on a second face of the package, the second face being opposed to the first face, feed-through conductors connected to the metallizations and enabling the metallizations to be electrically connected to the interior of the cavity a ceramic base, the ceramic base being provided with a polarization means to recognize its orientation.

15. A package according to claim 14, characterized in that the base is surrounded by a small wall made of ceramic.

* * * * *